(12) United States Patent
Jones et al.

(10) Patent No.: US 7,772,048 B2
(45) Date of Patent: Aug. 10, 2010

(54) FORMING SEMICONDUCTOR FINS USING A SACRIFICIAL FIN

(75) Inventors: Robert E. Jones, Austin, TX (US); Rickey S. Brownson, Cedar Park, TX (US)

(73) Assignee: Freescale Semiconductor, Inc., Austin, TX (US)

(*) Notice: Subject to any disclaimer, the term of this patent is extended or adjusted under 35 U.S.C. 154(b) by 356 days.

(21) Appl. No.: 11/678,327

(22) Filed: Feb. 23, 2007

(65) Prior Publication Data

US 2008/0206934 A1    Aug. 28, 2008

(51) Int. Cl.
*H01L 21/8232* (2006.01)
(52) U.S. Cl. .............. 438/142; 438/639; 438/696; 438/157; 438/283; 438/284; 438/525; 438/526; 438/365; 438/401; 257/E21.205; 257/E21.235; 257/E29.131
(58) Field of Classification Search ............ 438/142
See application file for complete search history.

(56) References Cited

U.S. PATENT DOCUMENTS

| | | | | |
|---|---|---|---|---|
| 5,023,203 A * | 6/1991 | Choi | ............ | 438/696 |
| 5,399,507 A * | 3/1995 | Sun | ............ | 438/152 |
| 5,476,809 A * | 12/1995 | Kobayashi | ............ | 438/405 |
| 5,563,077 A * | 10/1996 | Ha | ............ | 438/156 |
| 5,675,164 A * | 10/1997 | Brunner et al. | ............ | 257/331 |
| 5,705,414 A * | 1/1998 | Lustig | ............ | 438/585 |
| 5,740,099 A * | 4/1998 | Tanigawa | ............ | 365/51 |
| 5,942,787 A * | 8/1999 | Gardner et al. | ............ | 257/408 |
| 6,107,125 A * | 8/2000 | Jaso et al. | ............ | 438/149 |
| 6,171,910 B1 * | 1/2001 | Hobbs et al. | ............ | 438/275 |
| 6,222,259 B1 | 4/2001 | Park et al. | | |
| 6,225,201 B1 * | 5/2001 | Gardner et al. | ............ | 438/585 |
| 6,271,113 B1 * | 8/2001 | Yoon et al. | ............ | 438/618 |
| 6,329,124 B1 * | 12/2001 | Rangarajan et al. | ............ | 430/313 |
| 6,337,516 B1 * | 1/2002 | Jones et al. | ............ | 257/752 |
| 6,358,827 B1 * | 3/2002 | Chen et al. | ............ | 438/585 |
| 6,362,057 B1 * | 3/2002 | Taylor et al. | ............ | 438/286 |
| 6,372,559 B1 * | 4/2002 | Crowder et al. | ............ | 438/157 |
| 6,391,753 B1 * | 5/2002 | Yu | ............ | 438/587 |
| 6,458,662 B1 * | 10/2002 | Yu | ............ | 438/286 |
| 6,472,258 B1 * | 10/2002 | Adkisson et al. | ............ | 438/192 |
| 6,475,869 B1 * | 11/2002 | Yu | ............ | 438/303 |
| 6,492,212 B1 * | 12/2002 | Ieong et al. | ............ | 438/157 |
| 6,524,901 B1 * | 2/2003 | Trivedi | ............ | 438/183 |
| 6,548,345 B2 * | 4/2003 | Hakey et al. | ............ | 438/243 |
| 6,583,469 B1 * | 6/2003 | Fried et al. | ............ | 257/329 |
| 6,596,642 B2 * | 7/2003 | Wu et al. | ............ | 438/705 |

(Continued)

*Primary Examiner*—Fernando L Toledo
*Assistant Examiner*—Ankush k Singal
(74) *Attorney, Agent, or Firm*—James L. Clingan, Jr.; Robert A. Rodriguez

(57) ABSTRACT

A semiconductor device is made by steps of removing portions of a first capping layer, removing portions of a sacrificial layer, recessing sidewalls, and forming fin structures. The step of removing portions of the first capping layer forms a first capping structure that covers portions of the sacrificial layer. The step of removing portions of the sacrificial layer removes portions of the sacrificial layer that are not covered by the first capping structure to define an intermediate structure. The step of recessing the sidewalls recesses sidewalls of the intermediate structure relative to edge regions of the first capping structure to form a sacrificial structure having recessed sidewalls. The step of forming fin structures forms fin structures adjacent to the recessed sidewalls.

13 Claims, 10 Drawing Sheets

U.S. PATENT DOCUMENTS

| | | | | |
|---|---|---|---|---|
| 6,642,090 B1* | 11/2003 | Fried et al. | | 438/164 |
| 6,645,797 B1* | 11/2003 | Buynoski et al. | | 438/157 |
| 6,657,252 B2* | 12/2003 | Fried et al. | | 257/316 |
| 6,664,173 B2* | 12/2003 | Doyle et al. | | 438/587 |
| 6,709,982 B1* | 3/2004 | Buynoski et al. | | 438/696 |
| 6,762,101 B2* | 7/2004 | Chan et al. | | 438/283 |
| 6,767,793 B2* | 7/2004 | Clark et al. | | 438/286 |
| 6,800,885 B1* | 10/2004 | An et al. | | 257/275 |
| 6,800,905 B2* | 10/2004 | Fried et al. | | 257/351 |
| 6,812,119 B1* | 11/2004 | Ahmed et al. | | 438/585 |
| 6,835,981 B2* | 12/2004 | Yamada et al. | | 257/347 |
| 6,872,647 B1* | 3/2005 | Yu et al. | | 438/585 |
| 6,921,963 B2* | 7/2005 | Krivokapic et al. | | 257/618 |
| 6,949,420 B1* | 9/2005 | Yamashita | | 438/149 |
| 6,951,783 B2* | 10/2005 | Mathew et al. | | 438/157 |
| 6,987,068 B2* | 1/2006 | Friis et al. | | 438/739 |
| 7,015,124 B1* | 3/2006 | Fisher et al. | | 438/586 |
| 7,029,958 B2* | 4/2006 | Tabery et al. | | 438/151 |
| 7,045,401 B2* | 5/2006 | Lee et al. | | 438/157 |
| 7,064,415 B1* | 6/2006 | Kalburge et al. | | 257/565 |
| 7,084,018 B1* | 8/2006 | Ahmed et al. | | 438/156 |
| 7,101,741 B2* | 9/2006 | Fried et al. | | 438/195 |
| 7,138,302 B2* | 11/2006 | Xiang et al. | | 438/142 |
| 7,141,476 B2* | 11/2006 | Dao | | 438/283 |
| 7,148,543 B2* | 12/2006 | Yamada et al. | | 257/347 |
| 7,176,534 B2* | 2/2007 | Hanafi et al. | | 257/382 |
| 7,183,142 B2* | 2/2007 | Anderson et al. | | 438/157 |
| 7,192,876 B2* | 3/2007 | Mathew et al. | | 438/720 |
| 7,198,995 B2* | 4/2007 | Chidambarrao et al. | | 438/157 |
| 7,262,084 B2* | 8/2007 | Zhu et al. | | 438/142 |
| 7,265,059 B2* | 9/2007 | Rao et al. | | 438/734 |
| 7,265,417 B2* | 9/2007 | Adkisson et al. | | 257/347 |
| 7,288,802 B2* | 10/2007 | Anderson et al. | | 257/192 |
| 7,291,536 B1* | 11/2007 | Kalburge et al. | | 438/321 |
| 7,323,748 B2* | 1/2008 | Yamada et al. | | 257/347 |
| 7,341,916 B2* | 3/2008 | Lojek | | 438/284 |
| 7,348,225 B2* | 3/2008 | Zhu | | 438/157 |
| 7,348,641 B2* | 3/2008 | Zhu et al. | | 257/401 |
| 7,387,937 B2* | 6/2008 | Anderson et al. | | 438/281 |
| 7,396,711 B2* | 7/2008 | Shah et al. | | 438/164 |
| 7,407,890 B2* | 8/2008 | Yang | | 438/696 |
| 7,432,122 B2* | 10/2008 | Mathew et al. | | 438/48 |
| 7,455,956 B2* | 11/2008 | Sandhu et al. | | 430/313 |
| 7,456,476 B2* | 11/2008 | Hareland et al. | | 257/349 |
| 7,473,967 B2* | 1/2009 | Sorada et al. | | 257/347 |
| 7,491,589 B2* | 2/2009 | Anderson et al. | | 438/157 |
| 7,498,225 B1* | 3/2009 | Wang et al. | | 438/283 |
| 2001/0009784 A1* | 7/2001 | Ma et al. | | 438/197 |
| 2002/0130354 A1* | 9/2002 | Sekigawa et al. | | 257/315 |
| 2002/0140039 A1* | 10/2002 | Adkisson et al. | | 257/377 |
| 2003/0027059 A1* | 2/2003 | Schweeger | | 430/5 |
| 2003/0067017 A1* | 4/2003 | Ieong et al. | | 257/206 |
| 2003/0102497 A1* | 6/2003 | Fried et al. | | 257/255 |
| 2003/0146488 A1* | 8/2003 | Nagano et al. | | 257/506 |
| 2003/0151077 A1* | 8/2003 | Mathew et al. | | 257/250 |
| 2003/0178677 A1* | 9/2003 | Clark et al. | | 257/347 |
| 2003/0193058 A1* | 10/2003 | Fried et al. | | 257/200 |
| 2003/0201458 A1* | 10/2003 | Clark et al. | | 257/192 |
| 2003/0227036 A1* | 12/2003 | Sugiyama et al. | | 257/288 |
| 2004/0007738 A1* | 1/2004 | Fried et al. | | 257/329 |
| 2004/0038436 A1* | 2/2004 | Mori et al. | | 438/17 |
| 2004/0119100 A1* | 6/2004 | Nowak et al. | | 257/204 |
| 2004/0150044 A1* | 8/2004 | Nagano et al. | | 257/347 |
| 2004/0161898 A1* | 8/2004 | Fried et al. | | 438/283 |
| 2004/0219722 A1* | 11/2004 | Pham et al. | | 438/157 |
| 2004/0256647 A1* | 12/2004 | Lee et al. | | 257/289 |
| 2004/0266076 A1* | 12/2004 | Doris et al. | | 438/157 |
| 2005/0048727 A1* | 3/2005 | Maszara et al. | | 438/285 |
| 2005/0059236 A1* | 3/2005 | Nishida et al. | | 438/655 |
| 2005/0077553 A1* | 4/2005 | Kim et al. | | 257/288 |
| 2005/0104091 A1* | 5/2005 | Tabery et al. | | 257/213 |
| 2005/0110085 A1* | 5/2005 | Zhu et al. | | 257/347 |
| 2005/0145954 A1* | 7/2005 | Zhu et al. | | 257/401 |
| 2006/0008973 A1* | 1/2006 | Phua et al. | | 438/231 |
| 2006/0084249 A1* | 4/2006 | Yamada | | 438/526 |
| 2006/0091450 A1* | 5/2006 | Zhu et al. | | 257/316 |
| 2006/0110928 A1* | 5/2006 | Degroote | | 438/719 |
| 2006/0113522 A1* | 6/2006 | Lee et al. | | 257/18 |
| 2006/0223265 A1* | 10/2006 | Chung | | 438/268 |
| 2006/0286743 A1* | 12/2006 | Lung et al. | | 438/238 |
| 2007/0065990 A1* | 3/2007 | Degroote et al. | | 438/142 |
| 2007/0099350 A1* | 5/2007 | Zhu | | 438/142 |
| 2007/0218620 A1* | 9/2007 | Zhu et al. | | 438/212 |
| 2007/0293013 A1* | 12/2007 | John et al. | | 438/372 |
| 2008/0105897 A1* | 5/2008 | Zhu | | 257/190 |

\* cited by examiner

US 7,772,048 B2

FORMING SEMICONDUCTOR FINS USING A SACRIFICIAL FIN

RELATED APPLICATIONS

This application is related to U.S. patent application Ser. No. 11/678322, titled "Semiconductor Fin Integration Using a Sacrificial Fin," filed on even date herewith, filed by the inventors hereof, and assigned to the assignee hereof,

BACKGROUND

1. Field

This disclosure relates generally to forming semiconductor fins for use in making semiconductor devices, and more specifically, to forming the semiconductor fins using a sacrificial fin.

2. Related Art

The use of semiconductor fins in making semiconductor devices provides advantages over planar semiconductor devices. Transistors having a fin for the channel can be made to have lower leakage and higher drive because the gate, being on two sides of the channel, has more control of the channel. One of the desires generally relevant to semiconductor devices, including those using semiconductor fins, is to increase the density; to increase the number of devices in a given area. In the case of semiconductor fins, the minimum fins spacing is lithographically limited. Transistors using fins, however, are not expected to fit all of the requirements of an integrated circuit design. Thus, one issue is integrating the fins with planar transistors while improving density.

Thus, there is a need to improve the density of semiconductor devices using fins while also having desirable electrical characteristics, and a further desire is to efficiently integrate semiconductor fins with planar transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a sacrificial fin is formed of silicon germanium (SiGe) with an overlying nitride layer. The SiGe fin is trimmed to result in the silicon nitride (nitride) layer having an overhang extending past the sides of the SiGe fin. Epitaxial silicon is grown on the sides of the SiGe fin. During the growth, the nitride overhang functions to contain the silicon growth which has the affect of reducing or eliminating the occurrence of facets in the silicon growth. The reduction or elimination of facets provides for more control of the silicon width. The SiGe fin is removed leaving two silicon fins that are then used in transistor formation. This is better understood by reference to the drawings in the following description.

Figure 1:
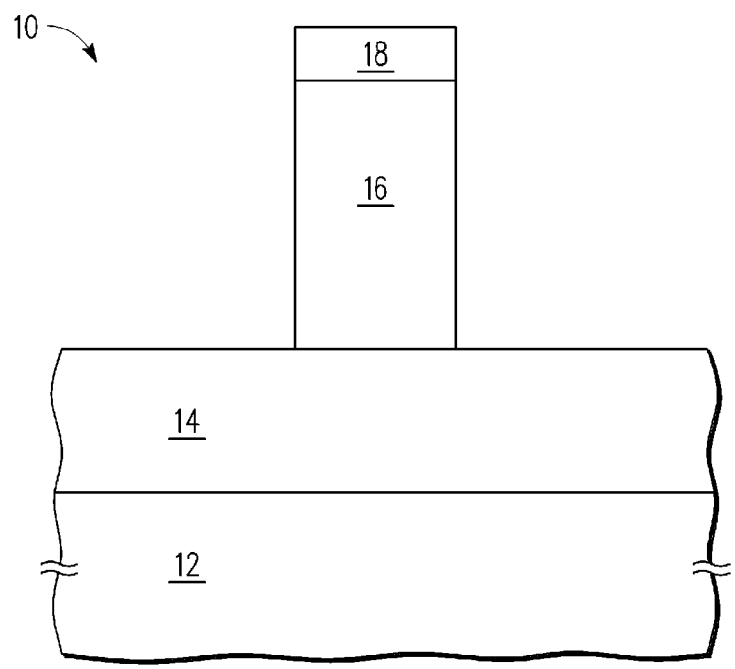
FIG. 1 is a cross section of a semiconductor device at a stage in processing according to an embodiment of the invention.

Shown in FIG. 1 is semiconductor device 10 comprising a substrate 12, an insulating layer 14, a silicon germanium (SiGe) fin 16 over insulating layer 14, and a capping layer 18 over SiGe fin 16. Substrate 12 and insulating layer 14 and SiGe fin 16 may be formed from a semiconductor-on-insulator (SOI) substrate in which the overlying semiconductor layer is SiGe. Substrate 12 can be considered a handle wafer portion because it provides structural support. In this case SiGe fin 16 may be about 100 nanometers (nm) in height. Capping layer 18 and SiGe fin 16 arise from forming a SiGe layer over insulating layer 14 and another layer, preferably nitride in this example, over the SiGe layer. The nitride layer is patterned and the SiGe is then patterned as well. The width of SiGe fin 16 is preferably the smallest that can be achieved by the lithography that is available but could be another width. SiGe fin 16 is the length that is desired for the fin transistor to be formed in silicon using SiGe fin 16. At the end of this length, not shown but conventional for fins, is a source/drain region that is also elevated at the same height as SiGe fin 16. This source/drain is also covered with the nitride.

Figure 2:
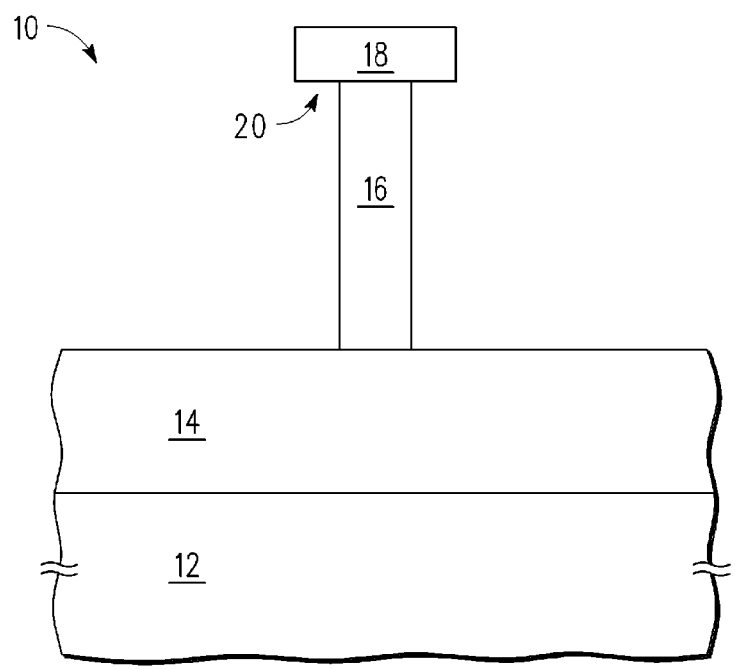
FIG. 2 is a cross section of the semiconductor device of FIG. 1 at a subsequent stage in processing.

Shown in FIG. 2 is semiconductor device 10 after trimming SiGe fin 16 which results in an overhang 20 where nitride layer 18 extends past the sides of trimmed SiGe fin 16. Preferably the overhang is about a fourth of the width of SiGe fin 16 of FIG. 1. Thus for an overhang on both sides of SiGe fin 16, trimming reduces the width in half to achieve the 25% overhang of overhang 20. Trimming is a well known process for silicon gates. Trimming processes, such as those used for trimming polysilicon gates, may be used with the corresponding adjustment in chemistry to account for the trimming being of SiGe instead of silicon. One such method is to oxidize along the sides and remove the resulting oxide. Another is to apply an isotropic etch.

Figure 3:
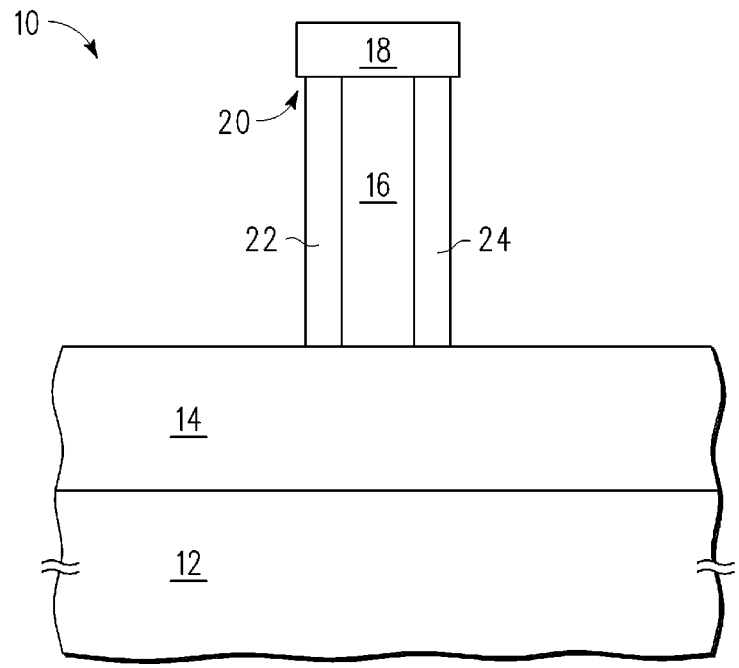
FIG. 3 is a cross section of the semiconductor device of FIG. 2 at a subsequent stage in processing.

Shown in FIG. 3 is semiconductor device 10 after epitaxially growing a silicon fin 22 on one sidewall of SiGe fin 16 and a silicon fin 24 on the other side of SiGe fin 16. Silicon fins 22 and 24 have a width a little less than the amount of the overhang of overhang 20. Thus, silicon fins 22 and 24 are less than 25% of the width of SiGe fin 16. Thus about 20% of the width of SiGe fin 16 is achievable. The result is that for every sacrificial SiGe fin, there are two silicon fins. The width of sacrificial SiGe fin 16 is of a width to achieve the desired width and spacing of silicon fins 22 and 24. The spacing of the SiGe fins is preferably the minimum spacing. Thus if the SiGe fins are at the minimum spacing or repeat distance, also commonly called minimum pitch, the density is doubled from what the minimum pitch would normally provide by having two silicon fins per sacrificial SiGe fin.

Figure 4:
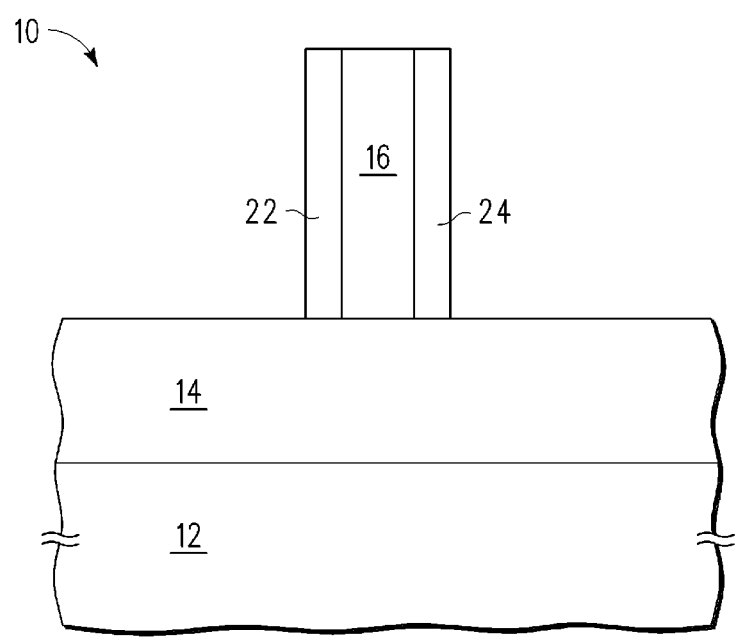
FIG. 4 is a cross section of the semiconductor device of FIG. 3 at a subsequent stage in processing.

Shown in FIG. 4 is semiconductor device 10 after removing capping layer 18 shown in FIG. 3. The portions of capping layer 18 over the SiGe source/drain regions, which are not shown in the FIGS. are not removed at this step. This has the affect of exposing SiGe fin 16.

Figure 5:
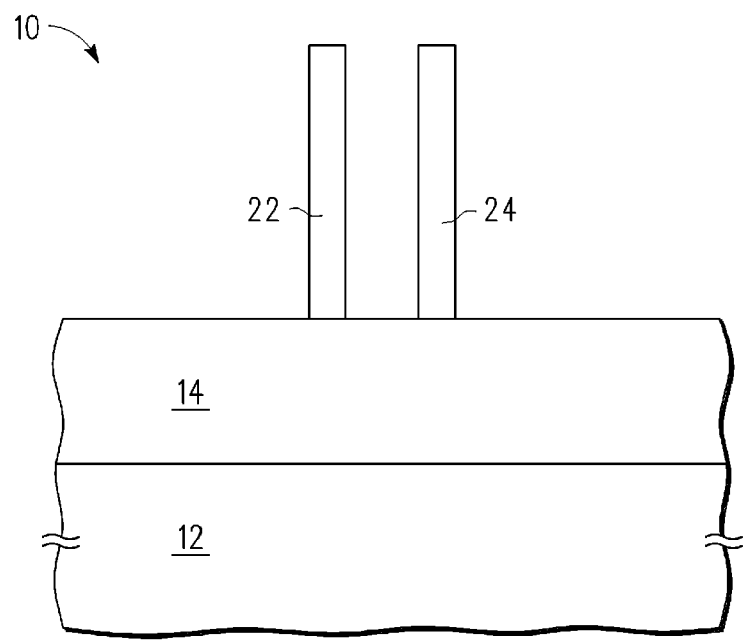
FIG. 5 is a cross section of the semiconductor device of FIG. 4 at a subsequent stage in processing.

Shown in FIG. 5 is semiconductor device 10 after removing SiGe fin 16. This leaves silicon fins 22 and 24 standing alone. There are etch chemistries that are selective between SiGe and silicon. One such chemistry is thermal gaseous HCl. Other selective etches include plasma fluorine chemistries or peroxide wet etches. Capping layer 18 over the SiGe source/drain regions may be removed after removing SiGe fin 16.

Figure 6:
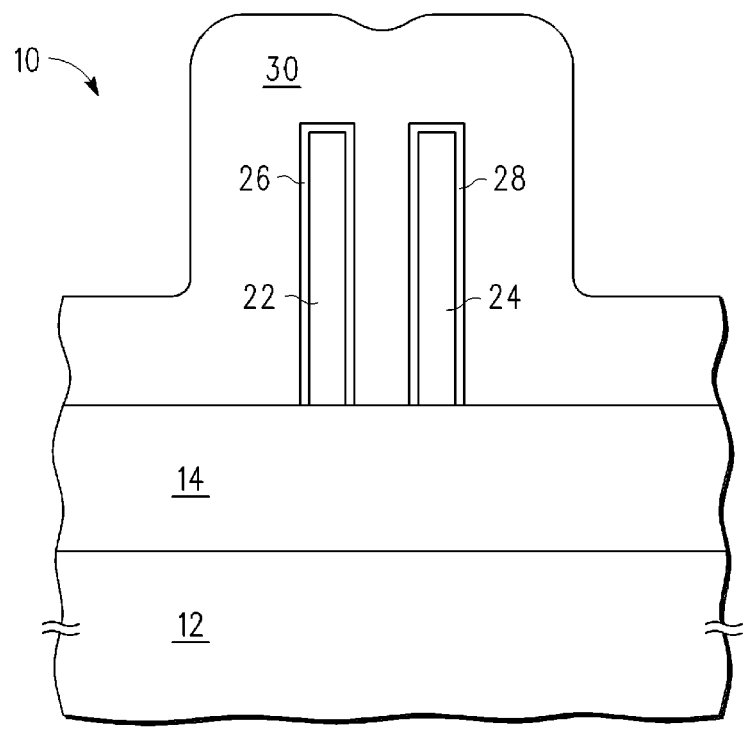
FIG. 6 is a cross section of the semiconductor device of FIG. 5 at a subsequent stage in processing.

Shown in FIG. 6 is semiconductor device 10 after forming a gate dielectric 26 on silicon fin 22, a gate dielectric 28 on semiconductor fin 24, and a polysilicon layer 30 on silicon fins 22 and 24. Gate dielectric 26 and gate dielectric 28 in this example are thermal oxides which may be grown in a typical fashion for gate dielectrics. An alternative would be to provide a high k gate dielectric such as hafnium oxide. In such case the gate dielectric would be deposited and would then be on the surface of insulating layer 14. Polysilicon layer 30 would be patterned and used as a gate. The view in FIG. 6 is unchanged by patterning polysilicon layer 30.

Thus it is seen that fins can be made using a sacrificial SiGe fin to grow sublithographic silicon fins. With the trimming of the SiGe fin, there is left an overhang of an overlying capping layer. The overhang of the overlying capping layer constrains the epitaxial silicon growth to occur in one direction only so that facets do not occur or at least are significantly reduced. Thus fins 22 and 24 have thicknesses that are substantially uniform and have a well controlled width.

Figure 7:
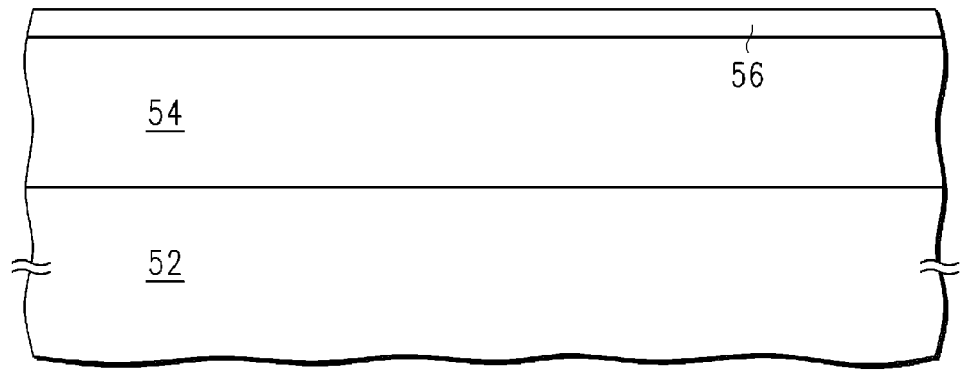
FIG. 7 is a cross section of a semiconductor device at a stage in processing according to another embodiment of the invention.

Shown in FIG. 7 is a semiconductor device 50 comprising a substrate 52 (handle wafer portion), an insulating layer 54 over substrate 52, and a silicon layer 56 over the insulating layer. This is similar to a conventional SOI wafer except that silicon layer 56 is preferably thinner than the semiconductor layer on a conventional SOI wafer. For example, silicon layer 56 is preferably about 20 nm or even less. This can be achieved in a conventional SOI substrate by oxidizing the semiconductor surface of a conventional SOI substrate and then removing the oxide. The thickness can be quite thin because its purpose is as a seed layer. It may be thicker than the minimum but because it will be part of the channel, it should still be sufficiently thin to allow sufficient channel control, especially to avoid excessive off-state leakage.

Figure 8:
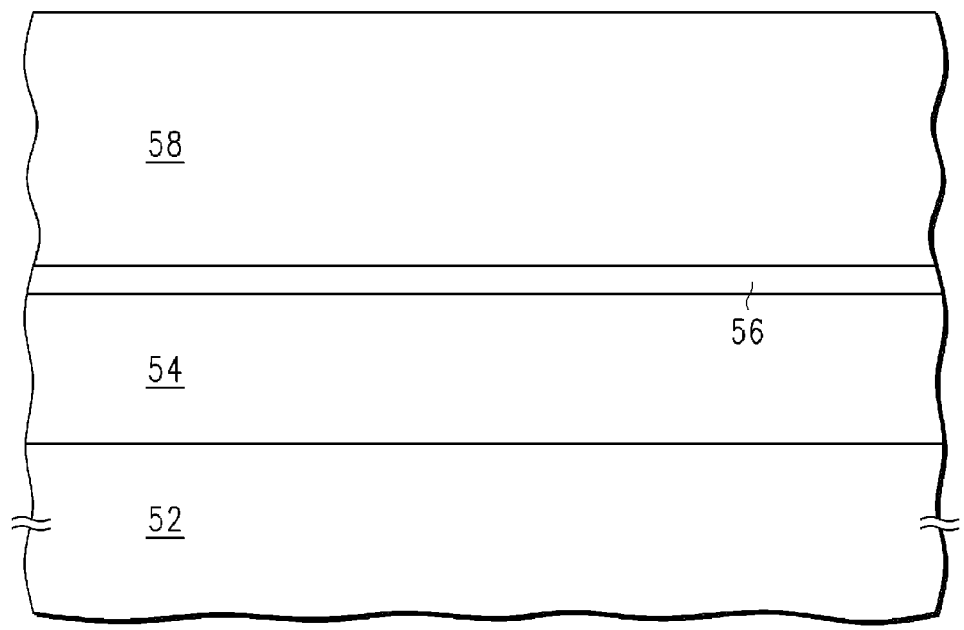
FIG. 8 is a cross section of the semiconductor device of FIG. 7 at a subsequent stage in processing.

Shown in FIG. 8 is semiconductor device 50 after growing a SiGe layer 58 on silicon layer 56. The height of SiGe layer 58 is the desired height of the fins that will be subsequently formed, which is about 100 nm but could be another height. This structure of semiconductor device 50 shown in FIG. 8 may also be directly available commercially from a vendor who may make it by this or another process such as layer transfer.

Figure 9:
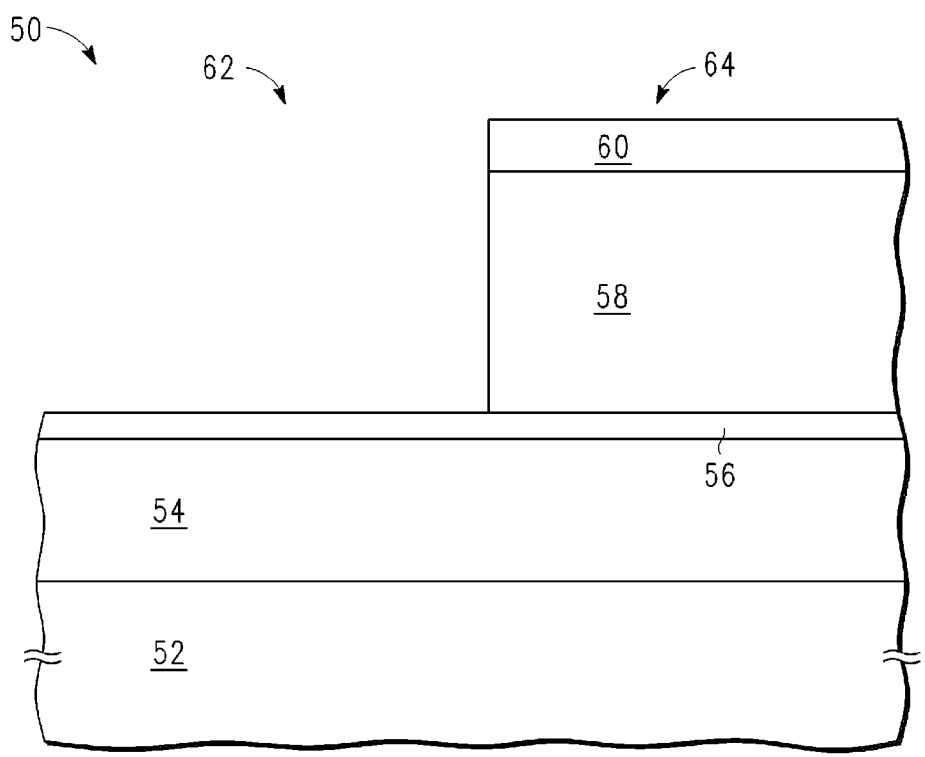
FIG. 9 is a cross section of the semiconductor device of FIG. 8 at a subsequent stage in processing.

Shown in FIG. 9 is semiconductor device 50 after forming a capping layer 60, preferably of oxide, over SiGe layer 58 and then removing a portion of SiGe layer 58 and capping layer 60. The removed portion is from a region 62 for forming planar transistors and the remaining portion of SiGe layer 58 is in a region 64 for forming fin transistors (finFETs). Silicon layer 56 is exposed in region 62.

Figure 10:
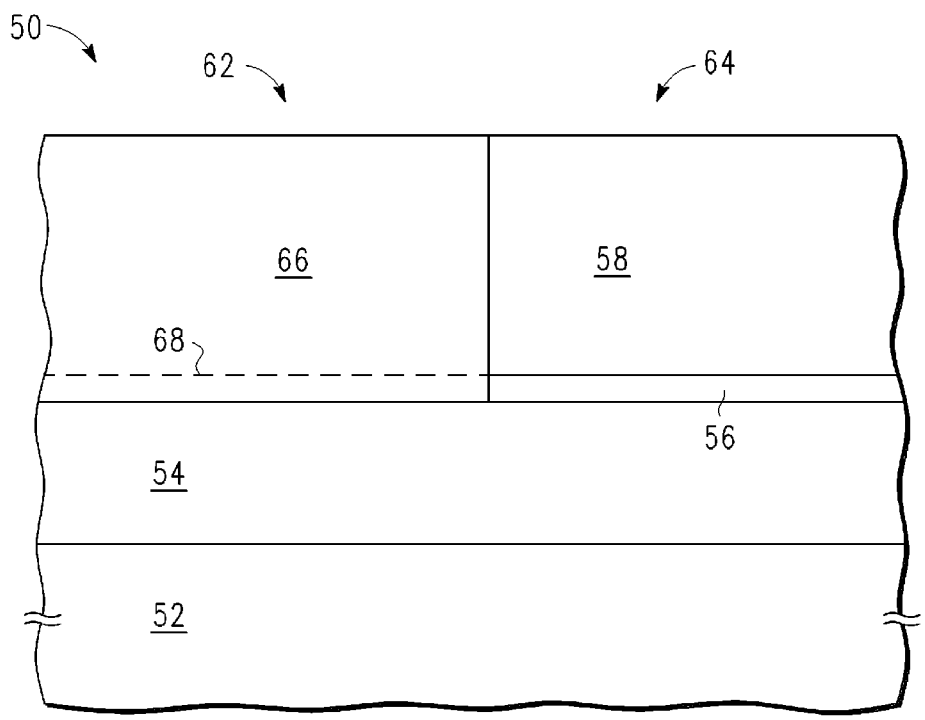
FIG. 10 is a cross section of the semiconductor device of FIG. 9 at a subsequent stage in processing.

Shown in FIG. 10 is semiconductor device 50 after selectively growing epitaxial silicon on silicon layer 56 to form an epitaxial layer 66 that will function as the body for planar transistors and then removing capping layer 60. Dotted line 68 shows the previous surface of silicon layer 56. Line 68 is dotted because the demarcation of silicon layer 56 would unlikely to be discernible after performing the epitaxial growth to form epitaxial layer 66.

Figure 11:
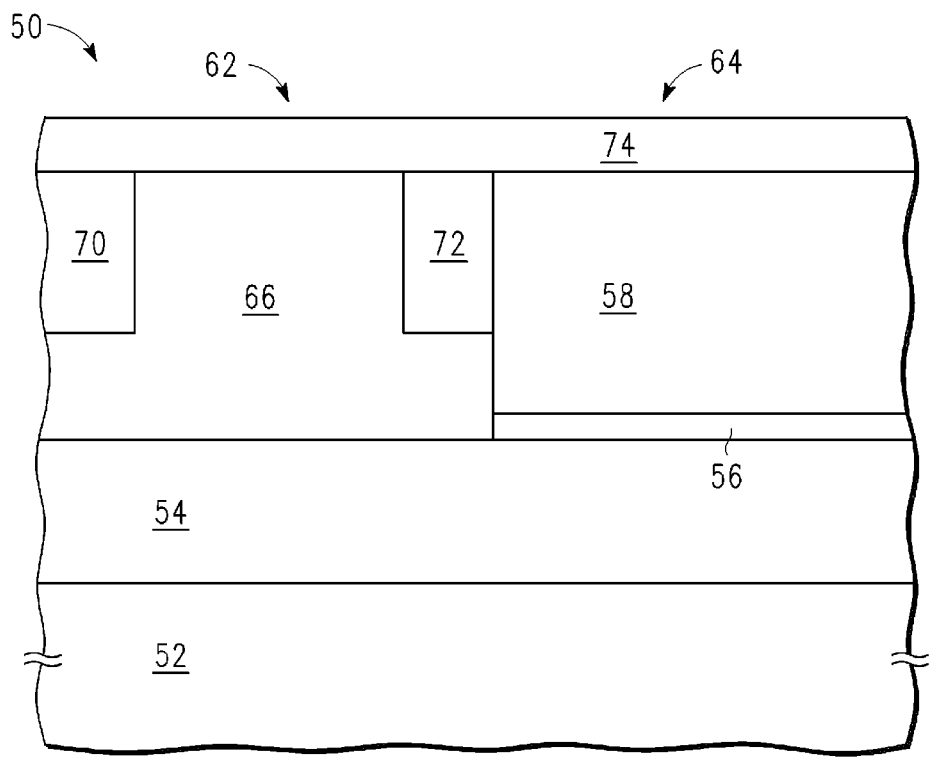
FIG. 11 is a cross section of the semiconductor device of FIG. 10 at a subsequent stage in processing.

Shown in FIG. 11 is semiconductor device 50 after forming isolation regions 70 and 72 in epitaxial layer 66 and forming a capping layer 74, preferably of nitride, over epitaxial layer 66, isolation regions 70 and 72, and SiGe layer 58. Capping layer 74 is preferably about 20-50 nm in thickness.

Figure 12:
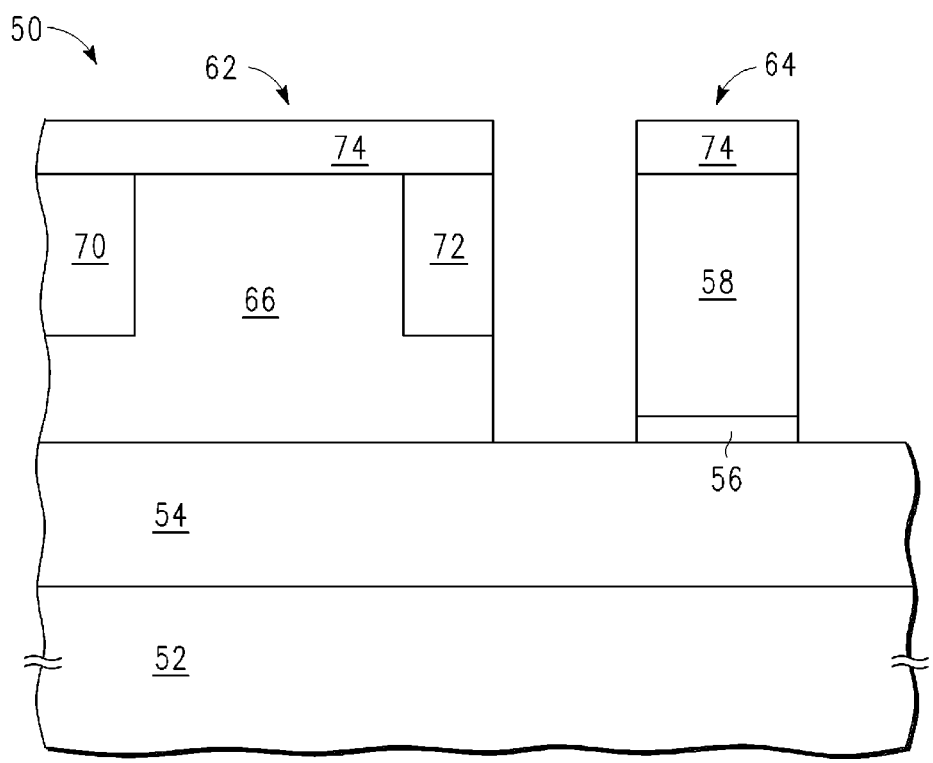
FIG. 12 is a cross section of the semiconductor device of FIG. 11 at a subsequent stage in processing.

Shown in FIG. 12 is semiconductor device 50 after performing a patterned etch through capping layer 74, SiGe layer 58, and silicon layer 56. This leaves a fin of SiGe similar to that of FIG. 1 and the dimensions may be the same. A difference is that SiGe layer 58 is over a silicon layer, silicon layer 56, whereas SiGe fin 16 is directly on an insulating layer. In this cross section of FIG. 12, only the fin portion of SiGe layer 58 is shown, but source/drain portions at the ends of the fin are present and covered by nitride layer 74.

Figure 13:
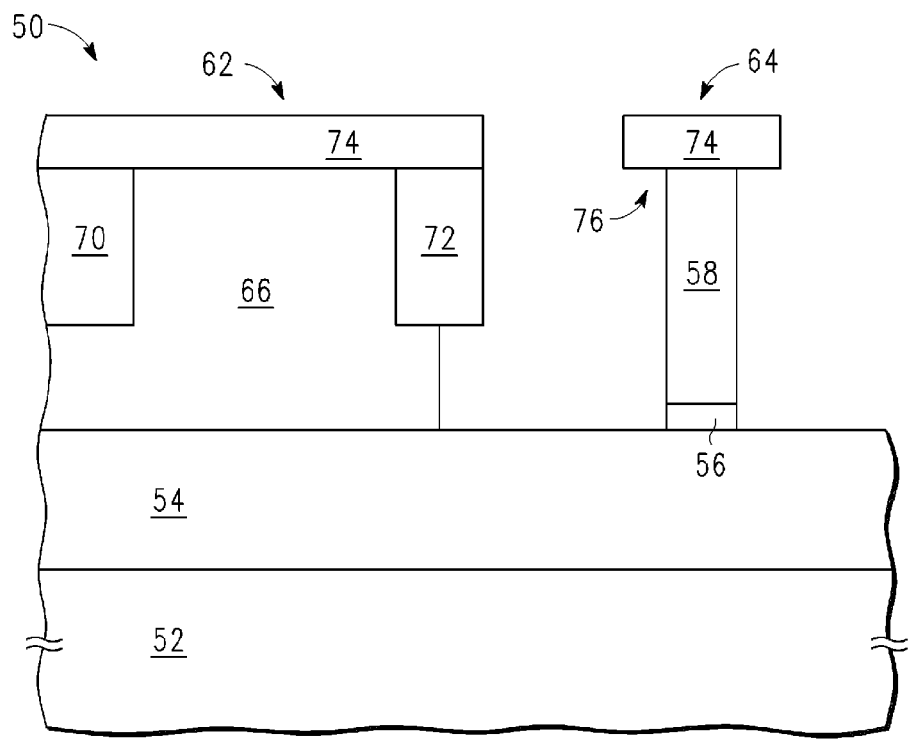
FIG. 13 is a cross section of the semiconductor device of FIG. 12 at a subsequent stage in processing.

Shown in FIG. 13 is semiconductor device 50 after trimming SiGe layer 58 and silicon layer 56. The trimming is the same as for the trimming shown in FIG. 2 except that both SiGe and silicon are being trimmed so if an isotropic etch is used, it preferably is not selective, or at least not significantly so, between silicon and SiGe. Capping layer 74 thus overhangs past the sides of trimmed SiGe layer and silicon layer 56 by an overhang 76. The trimming is symmetrical so capping layer 74 overhangs on both sides. The trim also etches the side of epitaxial layer 66.

Figure 14:
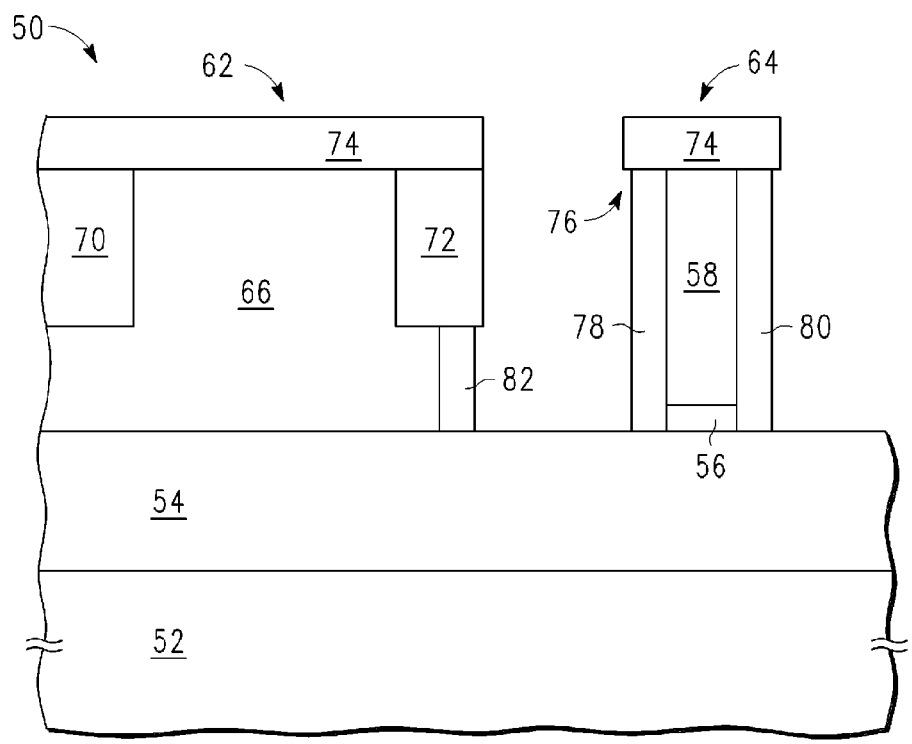
FIG. 14 is a cross section of the semiconductor device of FIG. 13 at a subsequent stage in processing.

Shown in FIG. 14 is semiconductor device 50 after silicon fins 78 and 80 are selectively epitaxially grown on the sides of SiGe layer 58 and silicon layer 56, and silicon fill 82 is simultaneously grown on the side of epitaxial layer 66. These silicon fins 78 and 80 are formed the same as described for silicon fins 22 and 24 of FIG. 3 except for the growth from silicon layer 56. Thus, silicon fins 78 and 80 are formed at about 20% of the width of the SiGe layer 58 of FIG. 12. As described relative to FIG. 3, the result is that for every sacrificial SiGe fin, there are two silicon fins. The width of 58 sacrificial SiGe layer is of a width to achieve the desired width and spacing for silicon fins 78 and 80. The spacing of the SiGe fins is preferably the minimum spacing. Thus if the SiGe fins are at the minimum spacing, also commonly called minimum pitch, the density is doubled from what the minimum pitch would normally provide by having two silicon fins per sacrificial SiGe fin. The lines between silicon layer 56 and silicon fins 78 and 80 are unlikely to be visible due to they are the same material and silicon fins 78 and 80 are epitaxially grown.

Figure 15:
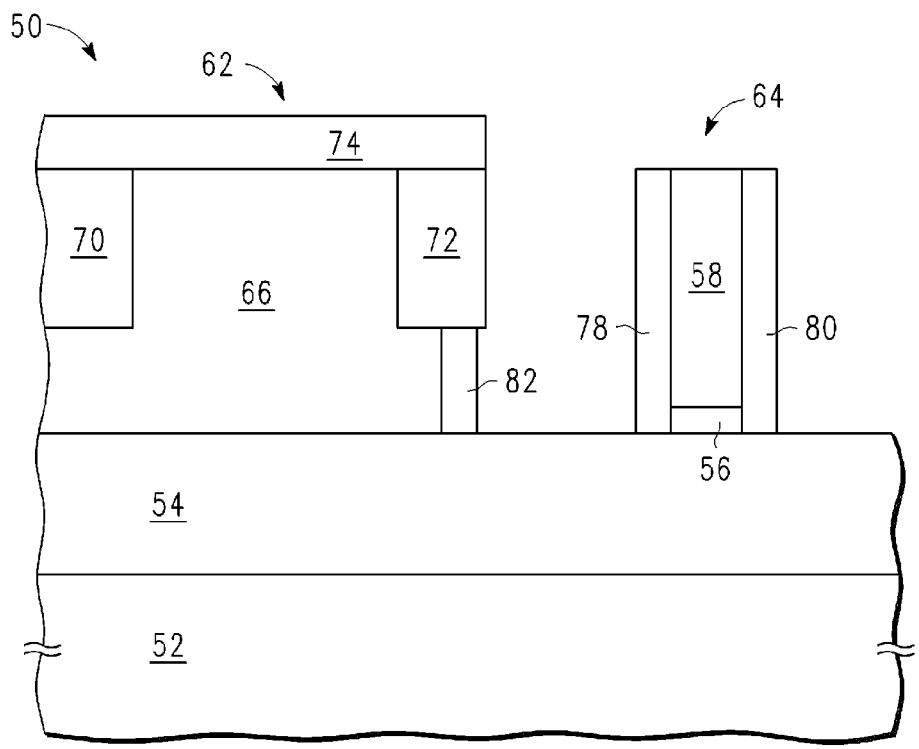
FIG. 15 is a cross section of the semiconductor device of FIG. 14 at a subsequent stage in processing.

Shown in FIG. 15 is semiconductor device 50 after removing capping layer 74 over the fin portion of SiGe layer 58, which is in region 64. The portions of capping layer 74 over region 62 and over the source/drain regions (not shown) are not removed at this time.

Figure 16:
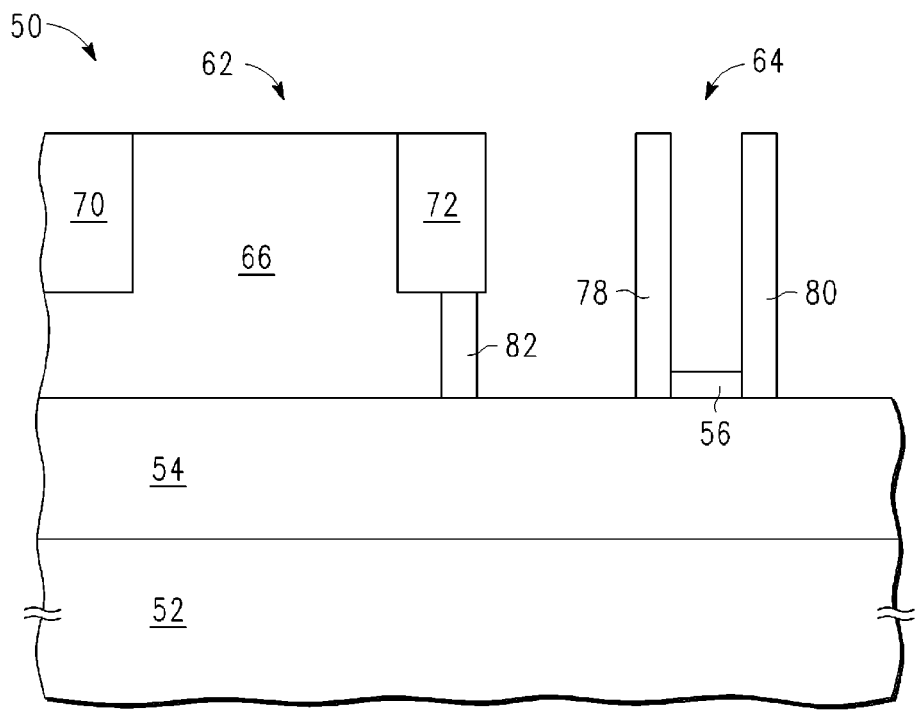
FIG. 16 is a cross section of the semiconductor device of FIG. 15 at a subsequent stage in processing.

Shown in FIG. 16 is semiconductor device 50 after removing the fin portion of SiGe layer 58. The source/drain regions are not removed because they are still capped by capping layer 74. The resulting structure has fins 78 and 80 with silicon layer 56 between them. The removing of SiGe is selective to silicon. An etch chemistry that is effective for this purpose is thermal gaseous HCl. Other selective etches include plasma fluorine chemistries or peroxide wet etches. Capping layer 74 over region 62 and over the source/drains is removed after the SiGe fin portion is removed.

Figure 17:
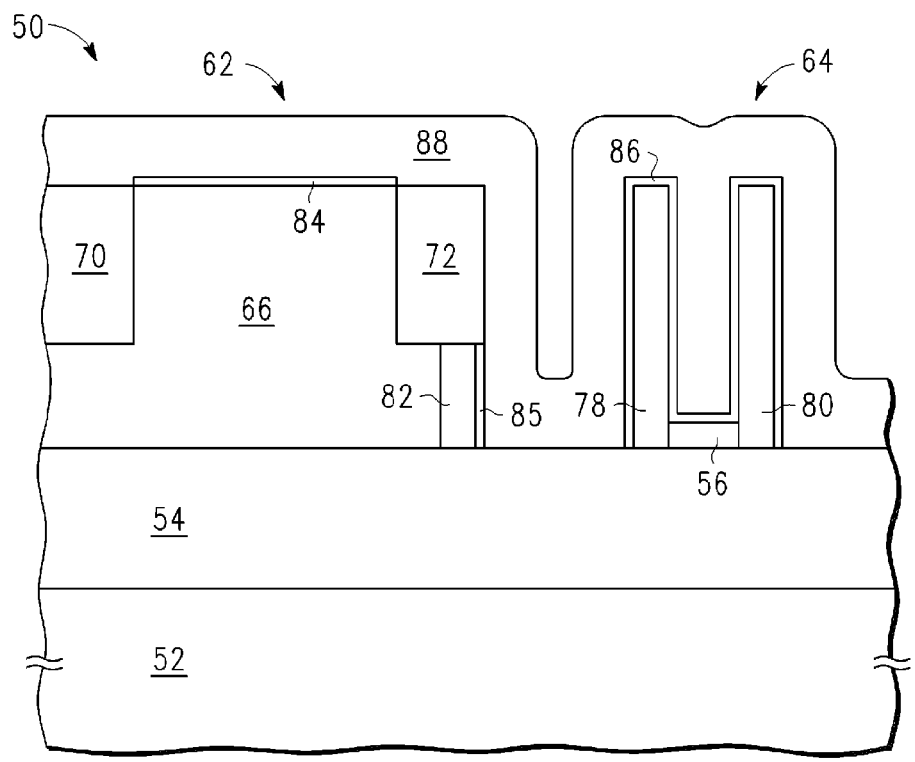
FIG. 17 is a cross section of the semiconductor device of FIG. 16 at a subsequent stage in processing.

Shown in FIG. 17 is semiconductor device 50 after forming a gate dielectric 84 on epitaxial layer 66, a gate dielectric layer 85 on the side of silicon fill 82, a gate dielectric layer 86 on silicon fins 78 and 80 and silicon layer 56, and a polysilicon layer 88 after forming gate dielectrics 84 and 86. As shown gate dielectrics 84 and 86 are preferably thermally grown oxide. An alternative would be to use another type of gate dielectric such as a high k dielectric such as hafnium oxide. In such case the gate dielectric would be deposited over all of the surfaces shown in FIG. 17 before the formation of polysilicon layer 88. Polysilicon layer 88 could be replaced by another gate electrode material other than polysilicon or in addition to polysilicon.

Figure 18:
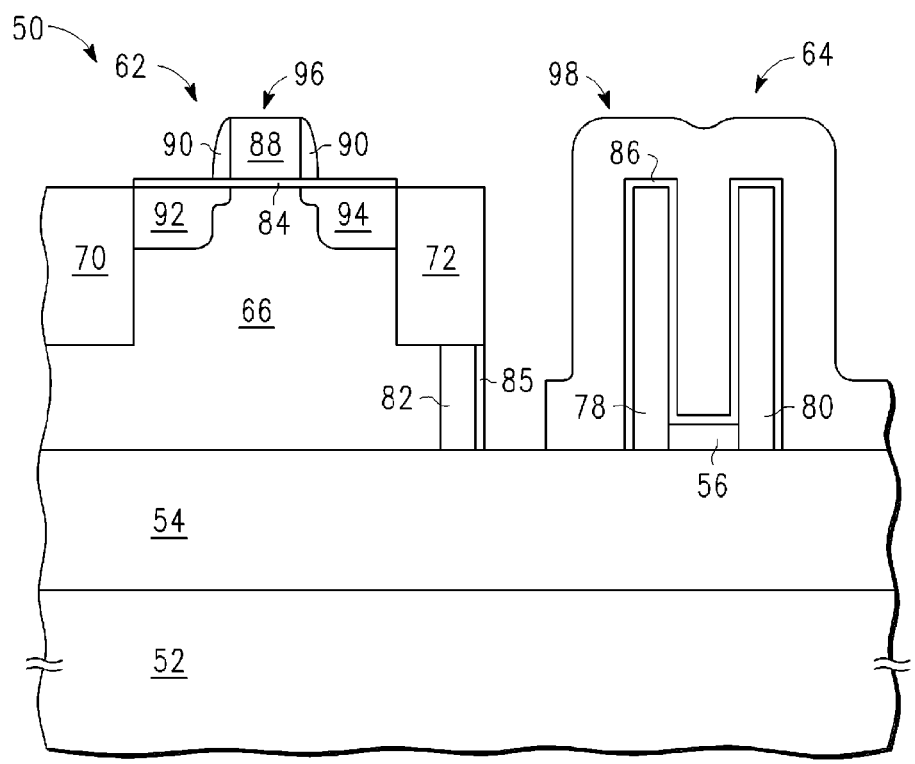
FIG. 18 is a cross section of the semiconductor device of FIG. 17 at a subsequent stage in processing.

Shown in FIG. 18 is semiconductor device 50 after patterning polysilicon layer 88 and forming a transistor 96 in region 62 and a transistor 98 in region 64. Transistor 96 is a planar transistor having a portion of polysilicon layer 88 as the gate, source/drains 92 and 94 in epitaxial layer 66, and sidewall spacer 90 around the gate.

Thus it is seen that there is an integration on the same substrate of an integrated circuit of a planar transistor and a finFET. This shows that this integration may be achieved while using the overhang to achieve the reduced faceting while achieving sublithographic pitch by having two silicon fins per sacrificial fin with the sacrificial fins being at the minimum pitch. Also the height of the planar transistor above insulating layer 54 is substantially the same as the height of the finFET. This is beneficial for subsequent processing.

Figure 19:
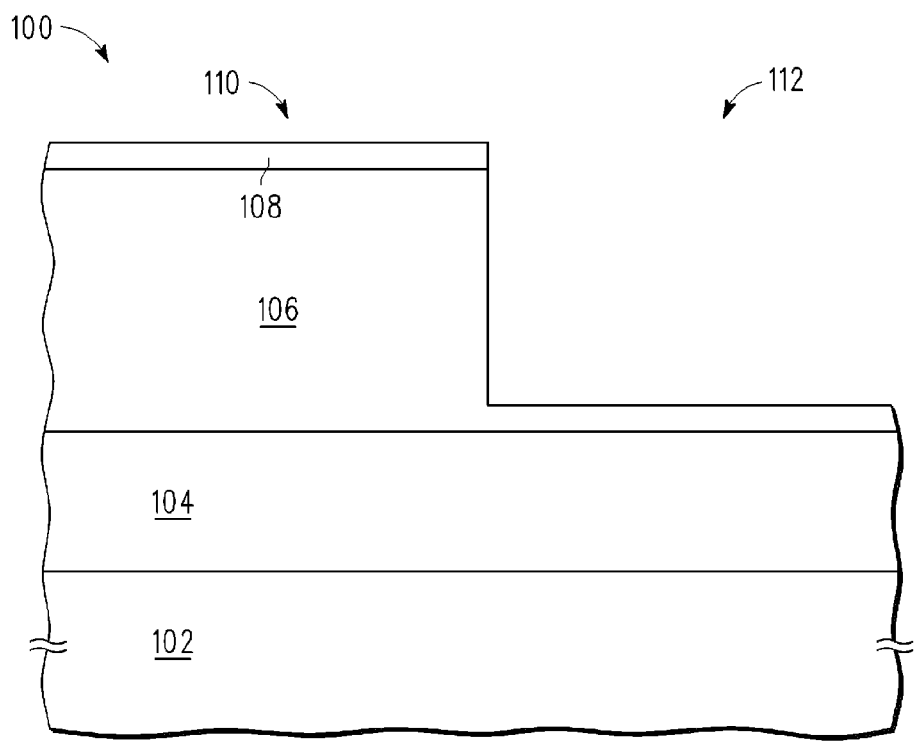
FIG. 19 is a cross section of a semiconductor device at stage in processing for an alternative to a obtaining a semiconductor device similar to that of FIG. 10.

Shown in FIG. 19 is a semiconductor device 100 comprising a substrate 102, an insulating layer 104, a silicon layer 106 that has been patterned, and a capping layer 108. Silicon layer 106 has a region 110 for planar transistors and a region 112 for forming finFETs. Silicon layer 106 has a height in region 110 that is about the same as the desired fin height and a height that is sufficient to function as a seed for SiGe epitaxial growth in region 112. This reduced height for silicon layer 106 in region 112 is achieved by a timed etch.

Figure 20:
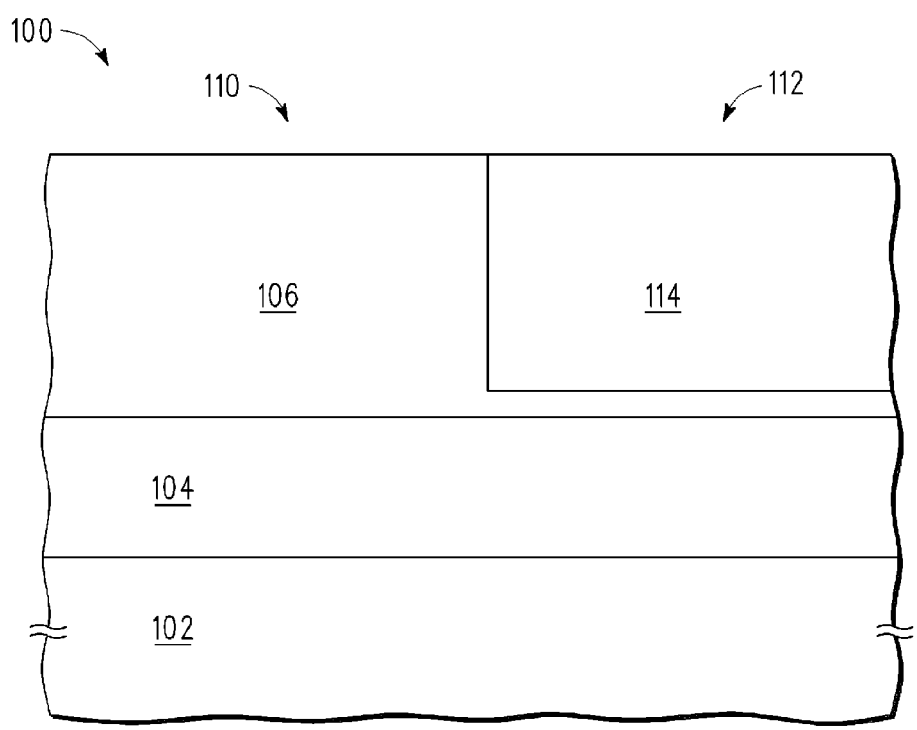
FIG. 20 is a cross section of the semiconductor device of FIG. 19 at a subsequent stage in processing.

Shown in FIG. 20 is semiconductor device 100 after epitaxially growing a SiGe layer 114 over silicon layer 106 in region 112 while capping layer 108 is present and then removing capping layer 108. This achieves the structure of FIG. 10. The process continues as described for FIGS. 11-18. This shows there are multiple techniques available to achieve the structure of FIG. 10.

Although the invention is described herein with reference to specific embodiments, various modifications and changes can be made without departing from the scope of the present invention as set forth in the claims below. For example, different materials may be used than those described. For example, the sacrificial fin may be a different material than SiGe and the fins to be left remaining may be a different material than silicon. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor device comprising:
   forming a first fin structure having a first semiconductor fin and a capping layer overlying the first semiconductor fin, wherein the first semiconductor fin has a first sidewall and a second sidewall aligned with sides of the capping layer;
   trimming the first semiconductor fin resulting in the capping layer having a first overhang extending past first sidewall and the second overhand extending past the second sidewall;
   epitaxially growing a second semiconductor fin on the first sidewall under the first overhang and a third semiconductor fin on the second sidewall under the second overhang;
   removing the capping layer to expose first semiconductor fin; and
   removing the first semiconductor fin by performing an etch that is selective between the first semiconductor fin and the second and third semiconductor fins.

2. The method of claim 1, wherein the step of trimming comprises performing an isotropic etch.

3. The method of claim 1, wherein the step of trimming comprises growing oxide on the first and second sidewalls and thereafter removing the.

4. The method of claim 1, further comprising:
   forming a first gate dielectric layer over the second and third fins;
   forming a first gate electrode layer over the first gate dielectric layer; and
   removing portions of the first gate electrode layer to form a first gate electrode that extends over portions of the second and third fins.

5. The method of claim 1, wherein the first semiconductor fin comprises silicon germanium and the second and third semiconductor fins comprise silicon.

6. A method for forming a semiconductor device comprising:
   forming a capping structure over a semiconductor layer;
   removing portions of the semiconductor layer not protected by the capping structure to form a first semiconductor fin from the semiconductor layer, wherein the first semiconductor fin has a first sidewall and a second sidewall;
   trimming the first semiconductor fin resulting in the capping layer having a first overhang extending past first sidewall and the second overhand extending past the second sidewall;

epitaxially growing a second semiconductor fin on the first sidewall under the first overhang and a third semiconductor fin on the second sidewall under the second overhang;

removing the capping structure to expose the first semiconductor fin; and removing the first semiconductor fin by performing an etch that is selective between the first semiconductor fin and the second and third semiconductor fins.

7. The method of claim 6 further comprising:

forming a gate dielectric layer over the second and third semiconductor fins;

forming a gate electrode layer over the gate dielectric layer; and removing portions of the gate electrode layer to form a gate electrode structure that extends over the second and third semiconductor fins.

8. The method of claim 7, wherein removing portions of the sacrificial layer not protected by the capping structure exposes portions of an underlying seed layer.

9. The method of claim 8 further comprising removing a first portion of the underlying seed layer prior to removing portions of the sacrificial structure in regions between the semiconductive fin structures, wherein after removing portions of the sacrificial structure in regions between fin structures, the fin structures are contiguous with a remaining portion of the underlying seed layer.

10. The method of claim 9, wherein the underlying seed layer is further characterized as a monocrystalline seed layer.

11. A method for forming a FinFET transistor comprising:

forming a first semiconductor material over a semiconductor seed layer to form a sacrificial layer;

forming a capping structure over the sacrificial layer to define exposed sacrificial layer regions and unexposed sacrificial layer regions, wherein the unexposed sacrificial layer regions are below the capping structure;

removing sacrificial layer material and underlying seed layer material from the exposed sacrificial layer regions to define a first semiconductor fin having a first sidewall and a second sidewall;

removing material from the first semiconductor fin resulting in having the first and second sidewalls recessed relative to a periphery of the capping structure whereby the capping structure has a first overhang extending past the first sidewall and a second overhang extending past the second sidewall;

epitaxially growing a layer of semiconductor material along the first and second sidewalls of the sacrificial structure, thereby substantially defining a second semiconductor fin on the first sidewall and a third semiconductor fin on the second sidewall;

removing the capping structure to expose the first semiconductor fin;

removing the first semiconductor fin to leave the second and third semiconductor fins;

forming a gate dielectric layer over the second and third semiconductor fins;

forming a gate electrode layer over the gate dielectric layer; and removing portions of the gate electrode layer to form a gate electrode structure that extends over the second and third semiconductor fins.

12. The method of claim 11, wherein removing material is further characterized as isotropically etching the first semiconductor fin.

13. The method of claim 11, wherein the step of epitaxially growing is further characterized as epitaxially depositing a silicon film along the first and second sidewalls.

* * * * *